(12) United States Patent
Wang et al.

(10) Patent No.: US 8,652,765 B2
(45) Date of Patent: Feb. 18, 2014

(54) MAKING A MICROFLUIDIC DEVICE WITH IMPROVED ADHESION

(75) Inventors: Yongcai Wang, Webster, NY (US); Weibin Zhang, Pittsford, NY (US); John A. Lebens, Rush, NY (US); James D. Huffman, Pittsford, NY (US); Robert E. McCovick, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 266 days.

(21) Appl. No.: 13/170,734

(22) Filed: Jun. 28, 2011

(65) Prior Publication Data

US 2013/0004898 A1    Jan. 3, 2013

(51) Int. Cl.
    *G03F 1/00* (2012.01)
(52) U.S. Cl.
    USPC .......................................... 430/320; 430/322
(58) Field of Classification Search
    USPC ................................. 430/320, 322
    See application file for complete search history.

(56) References Cited

U.S. PATENT DOCUMENTS

| 6,409,316 | B1 | 6/2002 | Clark et al. |
| 2002/0108860 | A1* | 8/2002 | Staats ........................... 204/601 |
| 2006/0091051 | A1* | 5/2006 | Takada et al. .............. 210/198.2 |
| 2010/0078407 | A1 | 4/2010 | Lebens et al. |

OTHER PUBLICATIONS

"VM-651 and VM-652 Adhesion Promoters", HD MicroSystems, Dec. 2003.

* cited by examiner

*Primary Examiner* — Stewart Fraser
(74) *Attorney, Agent, or Firm* — Peyton C. Watkins

(57) ABSTRACT

A method for making a microfluidic device, the method includes providing at least one inorganic layer on a substrate; applying an alkoxysilane material containing a primary or secondary amine on the at least one inorganic layer; baking the applied alkoxysilane material at a temperature greater than 130 degrees C.; applying an epoxy material to form an epoxy layer, wherein the applied alkoxysilane material is disposed at an interface between the epoxy layer and the at least one inorganic layer; and patterning the epoxy layer to provide a wall for defining a location for a fluid in the microfluidic device.

24 Claims, 9 Drawing Sheets

MAKING A MICROFLUIDIC DEVICE WITH IMPROVED ADHESION

CROSS REFERENCE TO RELATED APPLICATIONS

Reference is made to commonly assigned U.S. patent application Ser. No. 13/170,693 filed Jun. 28, 2011by Yongcai Wang et al., entitled "Microfluidic Device Having Improved Epoxy Layer Adhesion," the disclosure of which is herein incorporated by reference.

FIELD OF THE INVENTION

The present invention relates generally to an epoxy layer in a microfluidic device, and more particularly to improvement of the adhesion of the epoxy layer.

BACKGROUND OF THE INVENTION

Microfluidic devices are used in a wide range of fields for precise control and manipulation of fluids that are geometrically constrained to a small, typically sub-millimeter scale. Microfluidic structures include microsystems for the handling of off-chip fluids (liquid pumps, gas valves, etc.), as well as structures for the on-chip handling of nano-and picoliter volumes. To date, the most successful commercial application of microfluidics is the inkjet printhead. In inkjet printing, small droplets of ink are controllably directed toward a recording medium in order to form an image. Although the majority of the market for drop ejection devices is for the printing of inks, other markets are emerging such as ejection of polymers, conductive inks, or drug delivery. Advances in microfluidics technology are also utilized in recent molecular biology procedures for enzymatic analysis, DNA analysis, and proteomics. Microfluidic biochips integrate assay operations such as detection, as well as sample pre-treatment and sample preparation on one chip. Another emerging application area is biochips in clinical pathology, especially the immediate point-of-care diagnosis of diseases. In addition, microfluidics-based devices, capable of continuous sampling and real-time testing of air/water samples for biochemical toxins and other dangerous pathogens, can provide an always-on early warning.

Many microfluidic devices include a patterned polymer layer on a substrate, such as silicon, such that the patterned polymer layer includes walls for fluid passageways to direct the flow of fluid, or for chambers for constraining a small quantity of fluid. Typically the substrate includes one or more inorganic layers formed on a surface of the substrate, where the inorganic layers form structures for operating on the fluid in the microfluidic device in some fashion. The patterned polymer layer is typically formed over the inorganic layer(s). Adhesion of the patterned polymer layer to the inorganic layer(s) is important during fabrication as well as during storage and use of the microfluidic device, and it is well-known to apply an adhesion promoter on the inorganic layer(s) prior to applying the polymer material, or to incorporate adhesion promoter within the polymer material prior to applying it to the inorganic layers. Typical polymer layers are photo-sensitive polyimides and photo-sensitive epoxies. The family of photo-sensitive epoxies called SU-8 is prevalent in microfluidic devices, due to properties such as high stability to chemicals, excellent biocompatibility, and the ability to form high aspect ratio structures such as walls having a greater height than width.

Selection of an appropriate adhesion promoter is generally dependent upon the type of polymer layer that is used in the microfluidic device. The adhesion promoter provides bonding sites for the polymer material, as well as for the inorganic layer(s). A common class of adhesion promoter materials is the organofunctional alkoxysilane materials. The alkoxy groups are methoxy or ethoxy groups. These alkoxy groups can be displaced by hydroxyl groups in the inorganic layer(s), so that the surface of the inorganic layer(s) is silanized. In other words, covalent —Si—O—Si— bonds are formed at the surface.

Organofunctional alkoxysilane materials also include an organic function for promoting bonds to the polymer material. Organofunctional alkoxysilane materials are classified according to their organic functions. For example, in aminosilanes the organic function is a primary or secondary amine. Aminosilanes are conventionally used as adhesion promoters for promoting the adhesion of polyimide to silicon or other inorganic materials, since the amino group promotes adhesion to polyimide. A typical aminosilane adhesion promoter intended for improving the adhesion of polyimide is VM-652 (having an active ingredient of a-amino propyltriethoxysilane) available from HD Microsystems. For glycidosilanes the organic function is an epoxide. Glycidosilanes are conventionally used as adhesion promoters for promoting the adhesion of epoxies to silicon or other inorganic materials, since the epoxide group promotes adhesion to epoxies. A typical glycidosilane adhesion promoter intended for improving the adhesion of epoxy is A187 silane, or Z6040 (having an active ingredient of 3-glycidoxypropyltrimethoxysilane) available from Dow Corning. U.S. Pat. No. 6,409,316 describes the use of Z6040 as an adhesion promoter for SU-8 type epoxy for use in a thermal inkjet printing device.

Some fluids used in microfluidic devices weaken the adhesion at the interface between the patterned polymer layer and the inorganic layer(s). Such attack at the interface can be accelerated if the microfluidic device is stored or used at elevated temperature. Although the conventional glycidosilane adhesion promoters are found to work well to provide good adhesion for epoxy polymer layers to the inorganic layer(s) for the case of no exposure to fluids, or short-term exposure to fluids, or exposure to less aggressive fluids, it has been found that conventional glycidosilane adhesion promoters do not provide sufficient long-term adhesion for epoxy polymer layers exposed to some types of fluids, such as some aqueous based liquids.

What is needed is a microfluidic device and a method for making such a microfluidic device having improved adhesion of the epoxy polymer layer, particularly after extended exposure to fluids such as aqueous based fluids. An example of a microfluidic device intended for handling aqueous based fluids is an inkjet printhead used with aqueous based inks. Such inkjet printheads can include drop-on-demand printing devices from which drops are ejected as needed (e.g. by resistive heaters or piezoelectric actuators) in order to form an image. Inkjet printheads also include continuous inkjet printing devices where a continuous stream of liquid is forced through the device and formed into droplets which are selectively allowed to proceed to the recording medium or deflected to a gutter for recycling.

SUMMARY OF THE INVENTION

A method for making a microfluidic device, the method includes providing at least one inorganic layer on a substrate; applying an alkoxysilane material containing a primary or secondary amine on the at least one inorganic layer; baking the applied alkoxysilane material at a temperature greater than 130 degrees C.; applying an epoxy material to form an epoxy layer, wherein the applied alkoxysilane material is disposed at an interface between the epoxy layer and the at least one inorganic layer; and patterning the epoxy layer to provide a wall for defining a location for a fluid in the microfluidic device.

BRIEF DESCRIPTION OF THE DRAWINGS

In the detailed description of the preferred embodiments of the invention presented below, reference is made to the accompanying drawings, in which.

DETAILED DESCRIPTION OF THE INVENTION

Figure 1:
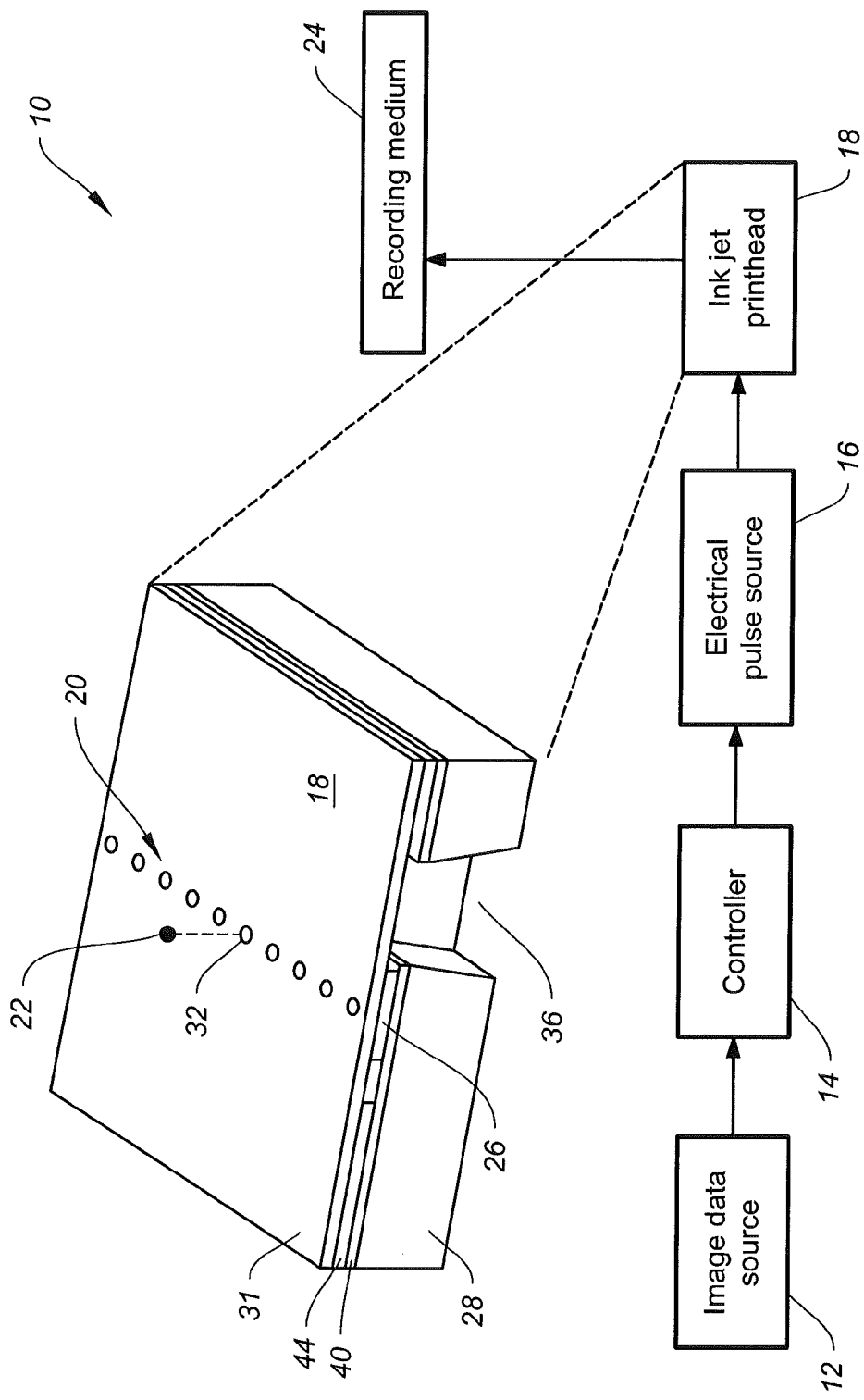
FIG. 1 is a schematic representation of a liquid ejection system incorporating the present invention.

The present description will be directed in particular to elements forming part of, or cooperating more directly with, apparatus in accordance with the present invention. It is to be understood that elements not specifically shown or described may take various forms well known to those skilled in the art. In the following description, identical reference numerals have been used, where possible, to designate identical elements.

As described in detail herein below, at least one embodiment of the present invention provides a microfluidic device and a method for making such a microfluidic device having an epoxy layer with excellent adhesion to one or more inorganic layers even after extended exposure to fluids such as aqueous based fluids. The most familiar of such devices are used as printheads in ink jet printing systems. Many other applications are emerging which make use of microfluidic devices for ejecting non-printing materials, or for fluid handling, or for chemical or biological analysis, for example. Although embodiments will be described in the context of inkjet printers, it is contemplated that other types of microfluidic devices will also benefit from the increased long-term reliability provided by the improved adhesion of the epoxy layer.

Referring to FIG. 1, a schematic representation of an inkjet printing system 10, utilizing a printhead fabricated according to the present invention, is shown. Inkjet printing system 10 includes an image data source 12 of data (for example, image data) which provides signals that are interpreted by a controller 14 as being commands to eject liquid drops. Controller 14 outputs signals to an electrical pulse source 16 of electrical energy pulses that are sent to liquid ejector printhead die 18, a partial section of which is shown in the figure. Typically, a liquid ejector printhead die 18 includes a plurality of liquid ejectors 20 arranged in at least one array, for example, a substantially linear row on substrate 28. The portion of the liquid ejector 20 that is visible in FIG. 1 is the nozzle(s) 32 in nozzle plate 31. During operation, ink enters liquid ejector printhead die 18 through feed hole(s) 36 and flows to chamber (s) bounded by wall(s) 26 from which ink drops 22 are ejected through nozzle orifices 32 and deposited on a recording medium 24. Walls 26 are formed in a polymer layer 44 that is adhered to at least one inorganic layer 40. Not shown in FIG. 1, are the drop forming mechanisms associated with the nozzles 32. Drop forming mechanisms can be of a variety of types, some of which include a heating element to vaporize a portion of ink and thereby cause ejection of a droplet, or a piezoelectric transducer to constrict the volume of a fluid chamber and thereby cause ejection, or an actuator which is made to move (for example, by heating a bi-layer element) and thereby cause ejection. In any case, electrical pulses from electrical pulse source 16 are sent to the various drop ejectors according to the desired deposition pattern.

Figure 2:
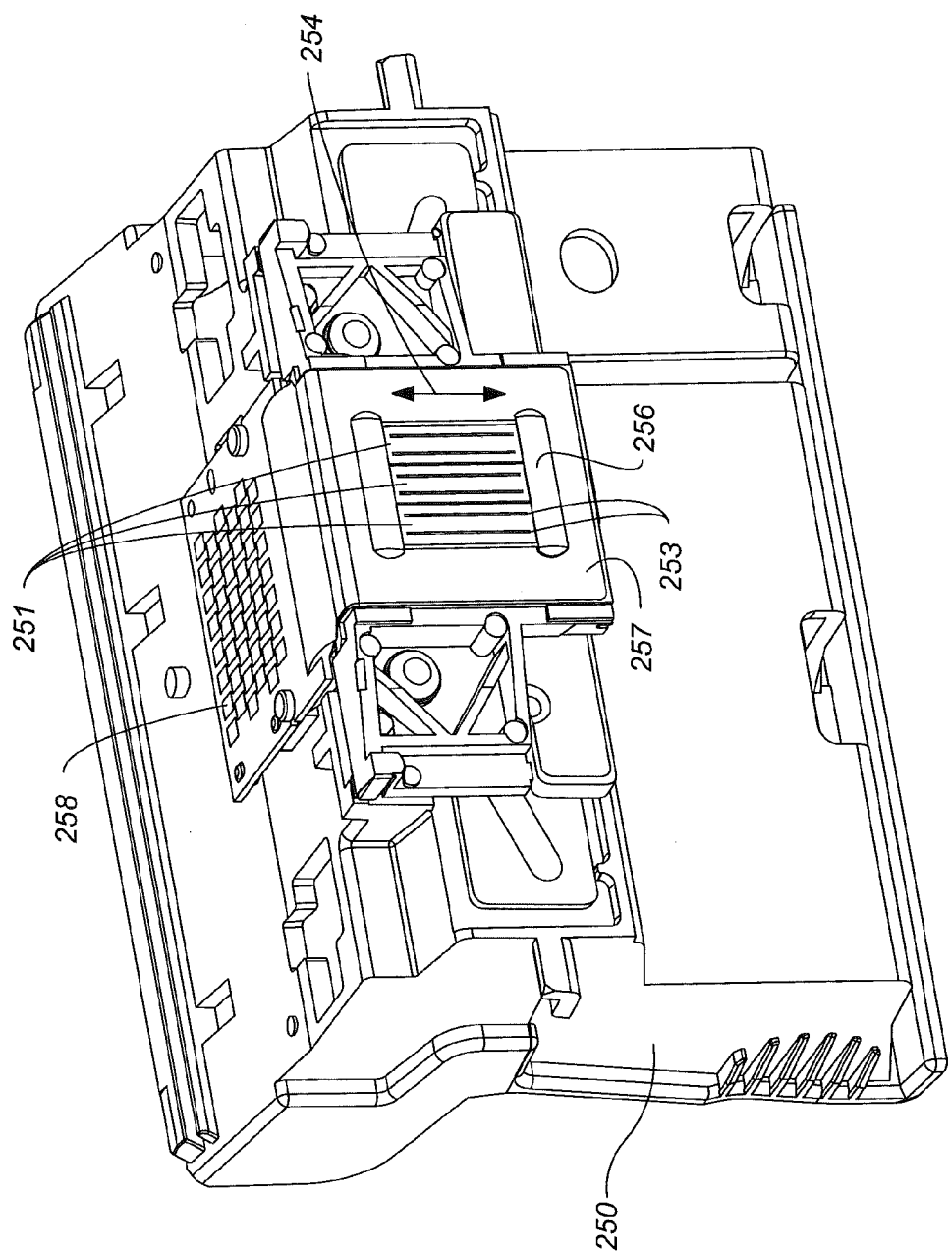
FIG. 2 is a perspective view of a portion of a printhead chassis.

FIG. 2 shows a perspective view of a portion of an inkjet printhead 250. Printhead 250 includes three printhead die 251 (similar to liquid ejector printhead die 18 in FIG. 1), each printhead die 251 containing two nozzle arrays 253, so that printhead 250 contains six nozzle arrays 253 altogether. The six nozzle arrays 253 in this example can each be connected to separate ink sources (not shown in FIG. 2); such as cyan, magenta, yellow, text black, photo black, and a colorless protective printing fluid. Each of the six nozzle arrays 253 is disposed along nozzle array direction 254, and the length of each nozzle array along the nozzle array direction 254 is typically on the order of 1 inch or less. Typical lengths of recording media are 6 inches for photographic prints (4 inches by 6 inches) or 11 inches for paper (8.5 by 11 inches). Thus, in order to print a full image, a number of swaths are successively printed while moving printhead 250 across the recording medium 24. Following the printing of a swath, the recording medium 24 is advanced along a media advance direction that is substantially parallel to nozzle array direction 254.

Also shown in FIG. 2 is a flex circuit 257 to which the printhead die 251 are electrically interconnected, for example, by wire bonding or TAB bonding. The interconnections are covered by an encapsulant 256 to protect them. Flex circuit 257 bends around the side of printhead chassis 250 and connects to connector board 258. When printhead 250 is mounted into the carriage 200 (see FIG. 3), connector board 258 is electrically connected to a connector (not shown) on the carriage 200, so that electrical signals can be transmitted to the printhead die 251.

Figure 3:
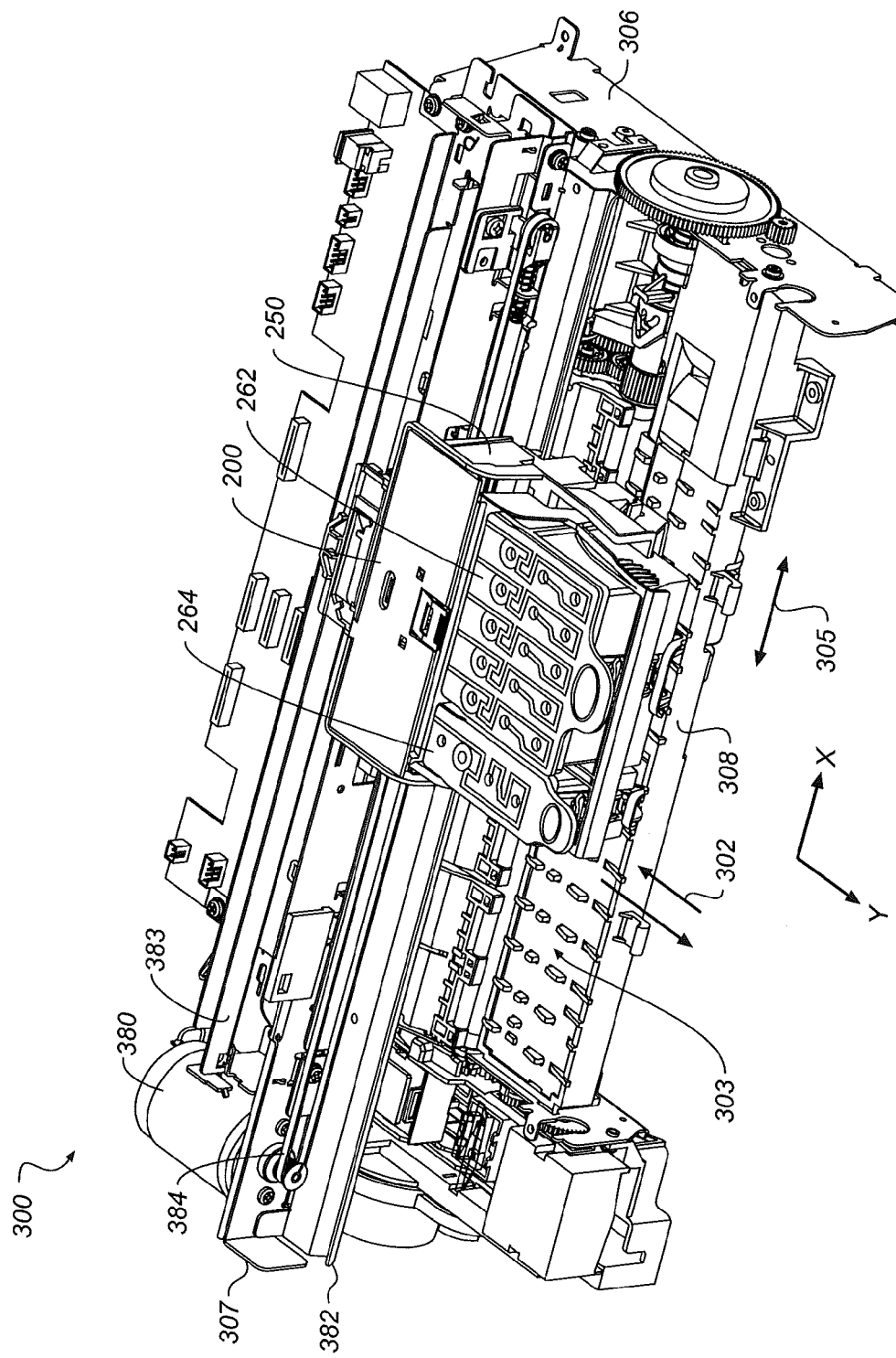
FIG. 3 is a perspective view of a portion of a carriage printer.

FIG. 3 shows a portion of a desktop carriage printer. Some of the parts of the printer have been hidden in the view shown in FIG. 3 so that other parts can be more clearly seen. Printer chassis 300 has a print region 303 across which carriage 200 is moved back and forth in carriage scan direction 305 along the X axis, between the right side 306 and the left side 307 of printer chassis 300, while drops are ejected from printhead die 251 (not shown in FIG. 3) on printhead chassis 250 that is mounted on carriage 200. Carriage motor 380 moves belt 384 to move carriage 200 along carriage guide rail 382. An encoder sensor (not shown) is mounted on carriage 200 and indicates carriage location relative to an encoder fence 383.

Printhead 250 is mounted in carriage 200, and multi-chamber ink supply 262 and single-chamber ink supply 264 are mounted in printhead 250. The mounting orientation of printhead 250 is rotated relative to the view in FIG. 2, so that the printhead die 251 are located at the bottom side of printhead 250, the droplets of ink being ejected downward onto the recording medium in print region 303 in the view of FIG. 3. Multi-chamber ink supply 262, in this example, contains five ink sources: cyan, magenta, yellow, photo black, and colorless protective fluid; while single-chamber ink supply 264 contains the ink source for text black. Typically, the inks are aqueous based inks. The inks can include dye-based colorants or pigmented colorants. Paper or other recording medium is loaded along paper load entry direction 302 toward the front of printer chassis 308. A variety of rollers move the recording medium through the printer.

Figure 4:
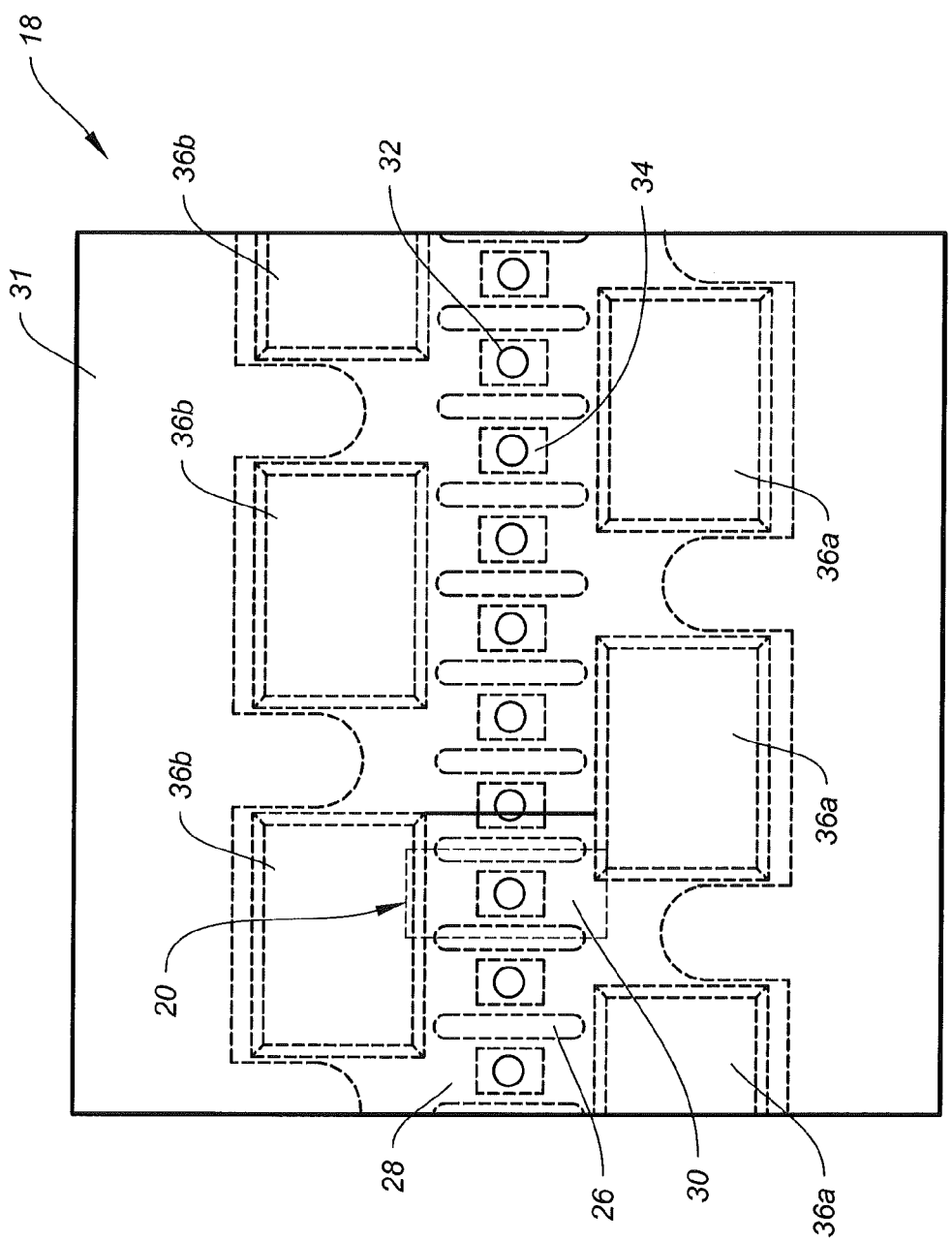
FIG. 4 is a schematic top view of a partial section of a liquid ejection printhead.
Figure 5:
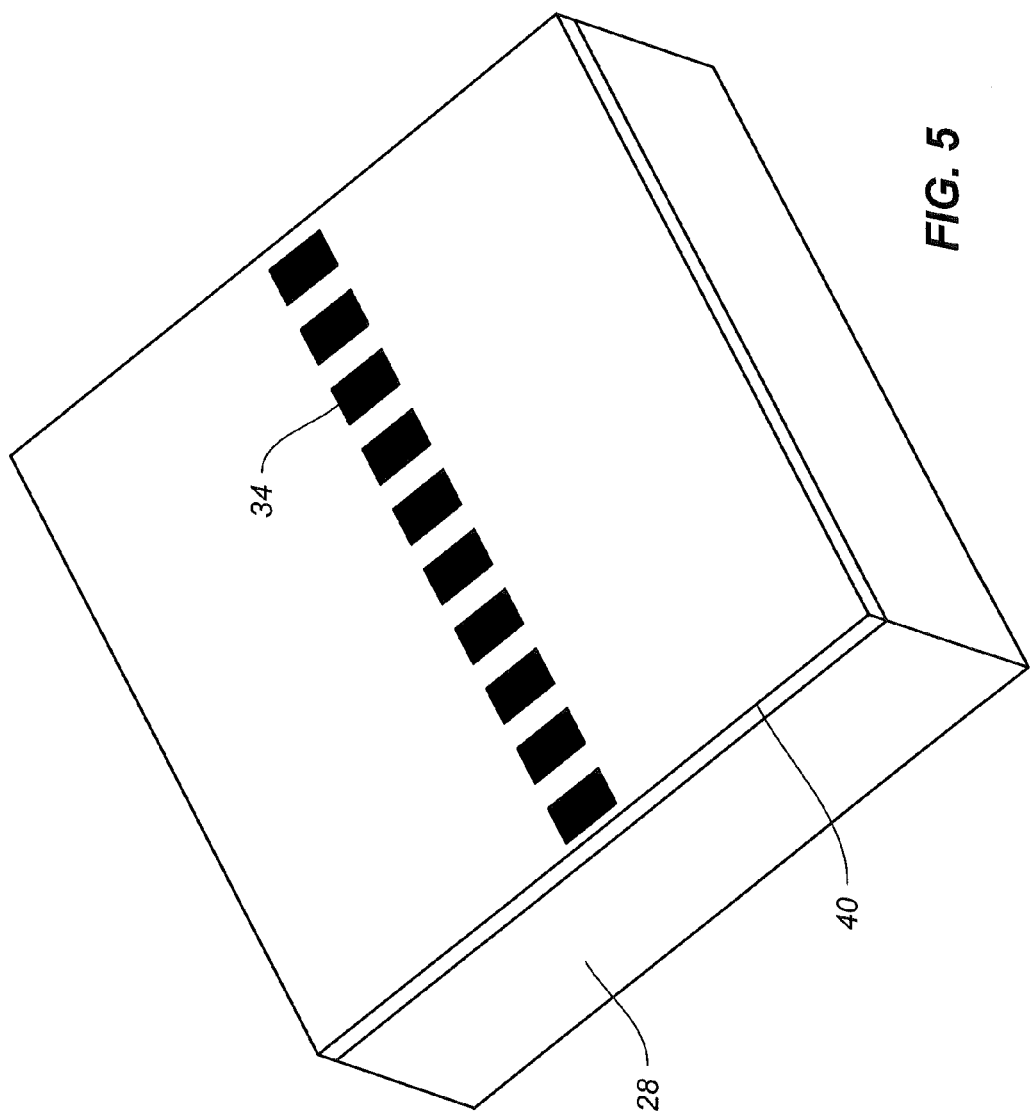
FIGS. 5-8 show one embodiment of a method for forming a liquid ejection printhead, shown schematically in FIG. 4, according to the present invention.

US Patent Application Publication No. 2010/0078407, incorporated herein by reference, describes a method for forming a liquid ejection printhead die that can be extended to incorporate an embodiment of the present invention to provide an example of a microfluidic device having an epoxy layer with excellent adhesion to one or more inorganic layers, even after extended exposure to fluids such as aqueous based inks. Referring to FIG. 4, a schematic representation of a top view of a partial section of a liquid ejector printhead die 18 for ink is shown. Liquid printhead die 18 includes an array or plurality of liquid ejectors 20, one of which is designated by the dotted line in FIG. 4. Liquid ejector 20 includes a structure, for example, having walls 26 extending from a substrate 28 that define a chamber 30 for holding a liquid, such as ink, prior to ejection of a droplet. The height of wall 26 is typically between 0.5 microns and 20 microns. Walls 26 do not need to totally enclose chamber 30. In the example shown in FIG. 4, chamber 30 is open at both ends. In other inkjet chamber configurations (not shown), walls can define three sides of the chamber. In still other microfluidic devices, walls 26 can totally surround a chamber. Furthermore, in addition to chambers, walls can define one or more passageways for a liquid to flow along. In any case, at least one wall defines a location for a fluid in the microfluidic device. Because such walls are exposed to the fluid in the microfluidic device, adhesion of the walls can be attacked. Walls 26 separate liquid ejectors 20 positioned adjacent to other liquid ejectors 20. Each chamber 30 includes a nozzle orifice 32 in nozzle plate 31 through which liquid is ejected. A drop forming mechanism, for example, a resistive heater 34 is also located in each chamber 30. In FIG. 4, the resistive heater 34 is positioned above the top surface of substrate 28 in the bottom of chamber 30 and opposite nozzle orifice 32, although other configurations are permitted In the exemplary dual feed configuration of FIG. 4, feed holes 36 consist of two linear arrays of feed holes 36a and 36b that supply liquid to the chambers 30 from two opposite sides. Feed holes 36a and 36b are positioned on opposite sides of the liquid ejector 20 containing chamber 30 and nozzle orifice 32. In FIG. 2 the feed holes 36 are arranged so that feed holes 36a are located primarily adjacent a pair of liquid ejectors 20 and feed holes 36b are located primarily adjacent the next pair of chambers 30 in the printhead array. Other dual feed geometries are also possible as disclosed in U.S. Pat. No. 7,857,422 and incorporated herein by reference. Still other liquid ejector printhead die configurations only contain a single feed hole that extends along the array of chambers in order to provide ink to them. In general for other types of microfluidic devices, some means for introducing fluid to the device is required. This can include one or more feed holes 36 that pass through substrate 28 (see FIG. 1).

FIGS. 5-8 illustrate a fabrication method of an exemplary embodiment of the present invention for forming a liquid ejection printhead die 18 having adhesion of an epoxy polymer layer that can withstand extended exposure to aqueous based inks. Many liquid ejection printhead die 18 are formed on the substrate 28 (a portion of one of which is shown), which is typically a silicon wafer. As shown as a partial section of a liquid ejection printhead die 18 in FIG. 5 a drop forming mechanism, in this case, an array of resistive heaters 34 is formed on top of an insulating dielectric layer, typically a silicon oxide layer that is formed on top of the silicon substrate 28. Fabricated in the liquid ejection printhead 18, but not shown, are electrical connections to the resistive heaters 34, as well as power LDMOS transistors and CMOS logic circuitry to control drop ejection. A silicon nitride layer can be deposited over the resistive heaters 34, as well as over other parts of the liquid ejection printhead die. A layer of tantalum can be deposited over at least portions the silicon nitride layer, especially over the resistive heaters 34 in order to provide additional protection against ink. In other words, at least one inorganic layer 40 is provided on substrate 28. Inorganic layer 40 can include silicon, silicon oxide, silicon nitride, tantalum, and metal for circuitry (typically aluminum). One or more of these materials can be disposed at the surface 41 (FIG. 6) of inorganic layer 40.

Figure 6:
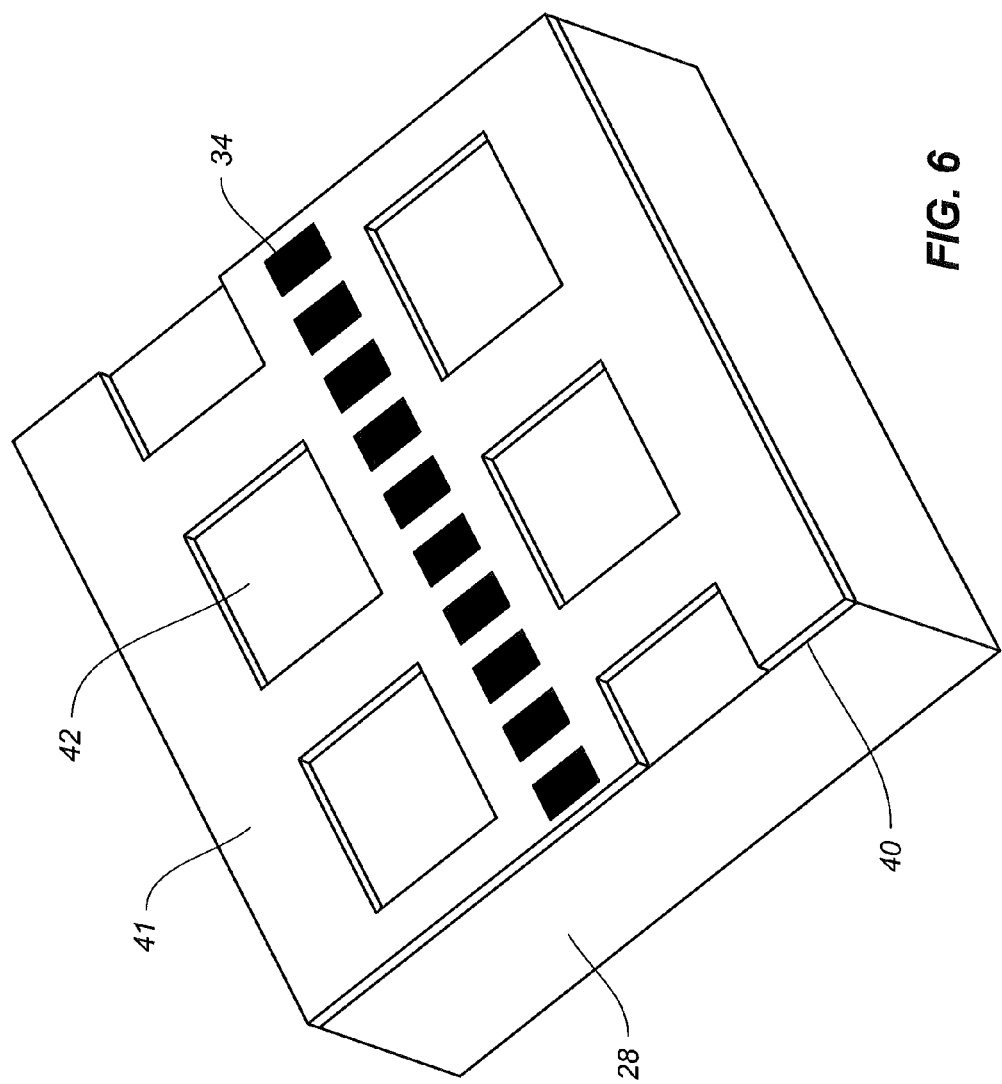

Shown in FIG. 6 are feed openings 42 that will subsequently be further extended to form feed holes 36 shown in FIGS. 1 and 4. In some embodiments, as described below, a thin epoxy layer (for example a 0.5 micron to 5 micron thick layer of TMMR) is formed over the entire surface 41 in FIG. 6, and then is patterned away from the feed openings 42 and the resistive heaters 34 so that it does not cover those regions. Similarly, it would also be patterned away from the bond pads (not shown) of the device. A thicker layer of TMMR or TMMF would then be applied to form the epoxy polymer layer 44 pattern shown in FIG. 7. Such a configuration can provide improved adhesion of walls 26 and other features, as discussed below.

Figure 7:
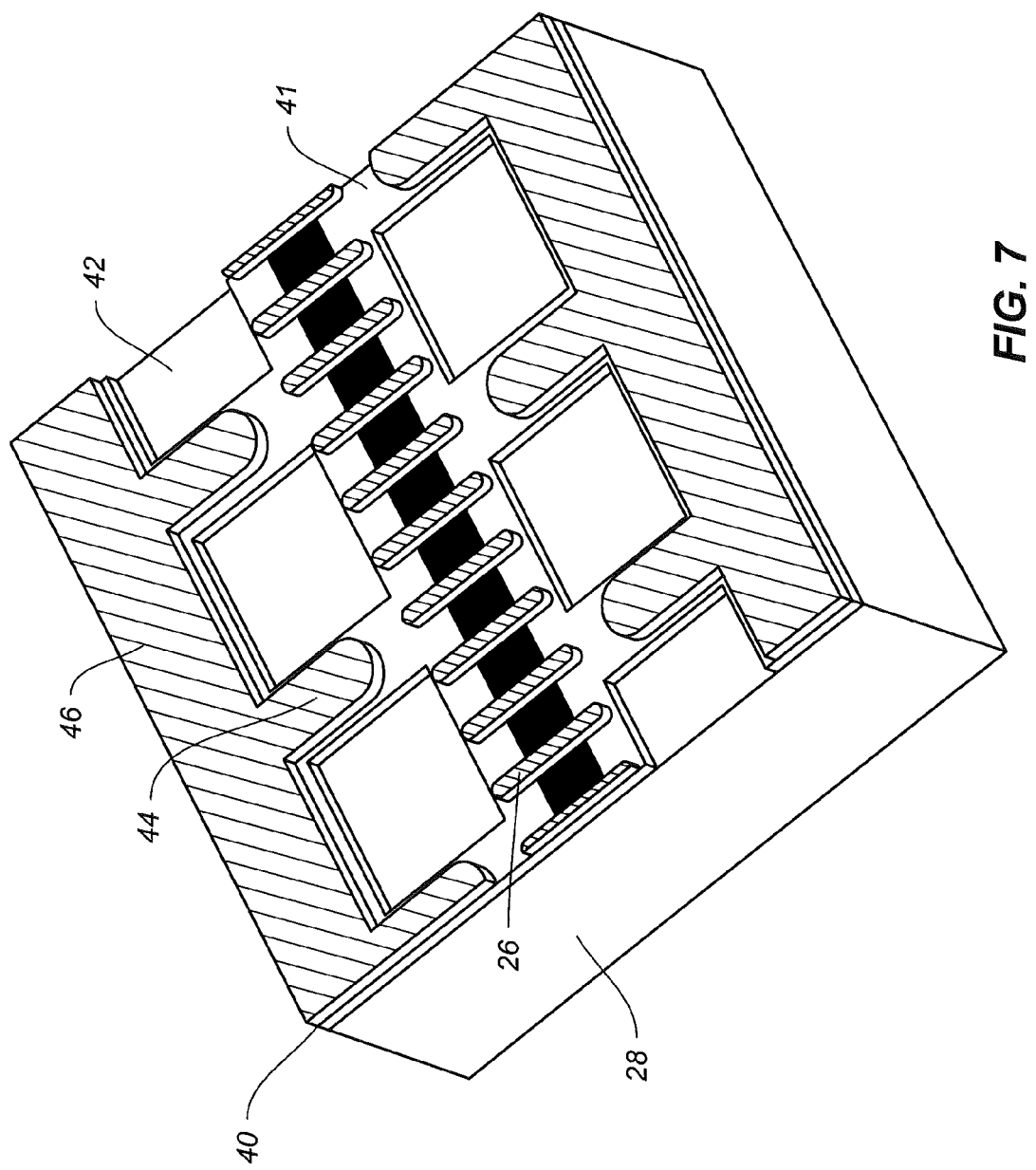

FIG. 7 shows a partial section of a liquid ejection printhead die 18 after formation of the polymer layer 44 that includes walls 26 between each liquid ejector 20 and an outer passivation layer 46 that extends over the rest of the liquid ejection printhead die 18 to protect the circuitry from liquid or fluid, such as ink. The polymer layer 44 can be formed by spin coating (spinning the wafer substrate after applying a liquid resist), and patterned by exposure through a mask, and development. A photoimageable epoxy such as a novolak resin based epoxy, for example, TMMR resist available from Tokyo Ohka Kogyo can be used for polymer layer 44. TMMR is an epoxy of the type that is more widely known as SU-8. In addition to the epoxy resin, TMMR resist also includes a glycidosilane adhesion promoter containing an epoxide and intended for improving the adhesion of epoxy. A dry film form of SU-8 is also supplied by Tokyo Ohka Kogyo called TMMF. Lamination of TMMF is an alternative to spinning on TMMR for providing the polymer layer.

It has been found during our testing that adhesion of epoxy polymer layers 44 to inorganic layer(s) 40 is attacked during extended exposure to at least some types of aqueous fluids, including some aqueous-based inks including some pigmented inks. Elevated temperature, high humidity and aggressive chemical solvents can be other stressful environments. Weakening of the adhesion occurred even if a glycidosilane adhesion promoter containing an epoxide and intended for improving the adhesion of epoxy, such as A187 silane, was applied to surface 41 (FIG. 5) prior to the forming of the epoxy polymer layer 44. Further details on test results are provided below in the examples section.

In testing of alternative adhesion promoter materials for improved adhesion of the epoxy polymer layer 44 to the inorganic layer(s) 40 at surface 41, a surprising and unexpected result was that an aminosilane adhesion promoter (i.e., an alkoxysilane material containing a primary or secondary amine) that is conventionally used for improving the adhesion of a polyimide layer to an inorganic layer was far more effective than a glycidosilane adhesion promoter in providing excellent adhesion between the epoxy polymer layer 44 and inorganic layer(s) 40 even after extended exposure to aqueous-based inks including pigmented inks. However, in order to achieve this improved performance, it was necessary to go beyond the manufacturer's recommended baking temperatures for the adhesion promoter. In particular, a December 2003 publication by HD MicroSystems on their VM-652 adhesion promoter (intended for improving adhesion of polyimide) says, "Although good adhesion is obtained by air-drying some products show increased adhesion with baking at 110-130 degrees C." For improving adhesion of an SU-8 epoxy polymer layer 44 to surface 41 of inorganic layer(s) 40, which can include silicon, oxide, nitride and tantalum, it was found that baking at a temperature of greater than 130 degrees C. after application of the adhesion promoter to surface 41 was required if adhesion was to remain strong after extended exposure to aqueous based inks. In particular it was found that baking the applied alkoxysilane material containing a primary or secondary amine by placing the substrate 28 on a hot plate at 150 degrees C. for at least one minute provided improvement, but at least ten minutes is preferred. Alternatively, placing the substrate 28 on a hot plate at 200 degrees C. for at least 20 seconds provided improvement, but at least two minutes is preferred. Further improvement can be provided by treating surface 41 with oxygen plasma prior to applying the alkoxysilane adhesion promoter such as VM-652. The oxygen plasma treatment can oxidize surface 41 as well as clean it, thereby providing an improved surface for the alkoxysilane material to adhere.

The active ingredient of VM-652 adhesion promoter is a-amino propyltriethoxysilane, but other materials of the alkoxysilane material family containing a primary or secondary amine can alternatively be used for improving the epoxy adhesion, including aminopropyl trimethoxysilane or bis[3-(trimethoxysily)-propyl]amine. It can further be beneficial if the alkoxysilane material containing a primary or secondary amine is hydrolyzed or partially hydrolyzed, for example by adding some water. In any case, the alkoxysilane material containing the primary or secondary amine is disposed at the interface between epoxy polymer layer 44 and the at least one inorganic layer 40. Typically the adhesion promoter is applied by flooding surface 41 of the inorganic layer(s) on substrate 28 with the alkoxysilane material and then spinning the substrate 28 (i.e. spinning the wafer).

Figure 8:
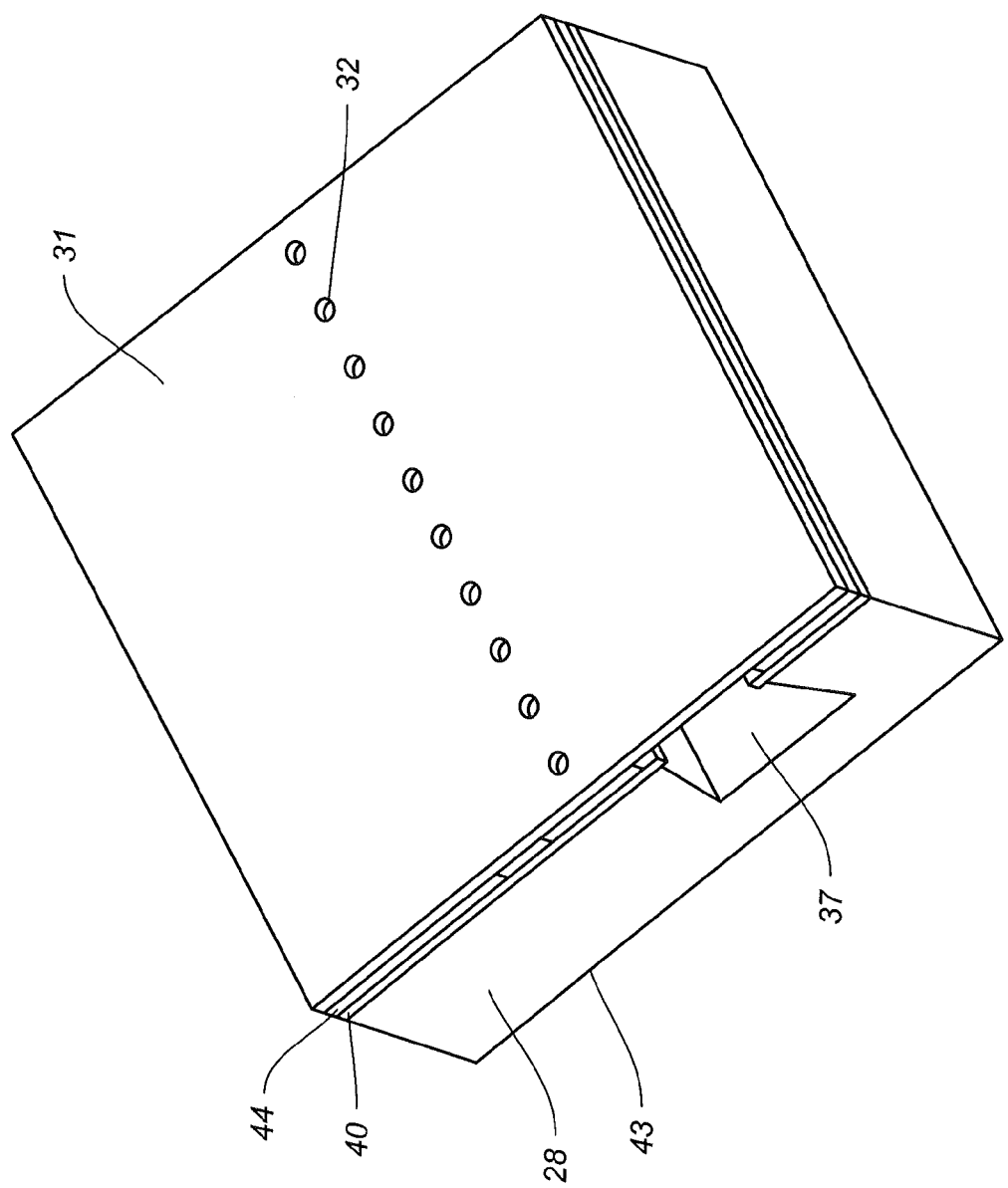

FIG. 8 shows a partial section of a liquid ejection printhead die 18 after a photoimageable nozzle plate layer 31 has been laminated over epoxy polymer layer 44, and patterned to form nozzles 32. The photoimageable nozzle plate layer 31 can be formed using a dry film photoimageable epoxy such as a novolak resin based epoxy, for example TMMF dry film resist available from Tokyo Ohka Kogyo. The use of a dry film laminate for the nozzle plate enables the formation of the nozzle plate 31 on the liquid ejection printhead containing high topography features such as the ink feed holes 36 (FIG. 1). With reference to FIGS. 7 and 8, feed openings 42 of FIG. 7 have been deepened prior to laminating nozzle plate 31, for example by etching from the side of substrate 28 that includes epoxy polymer layer 44, optionally protecting epoxy polymer layer 44 with a temporary resist material (not shown). Since the ink feed openings are not all the way through the substrate, but are still blind holes 37 at the time when nozzle plate layer 31 is laminated, there are no difficulties in applying vacuum to hold down the substrate 28 during lamination. Subsequently, blind holes 37 can be opened up from the backside 43 of substrate 28 by grinding and/or blanket etching, for example, to form feed hole(s) 36.

Figure 9A:
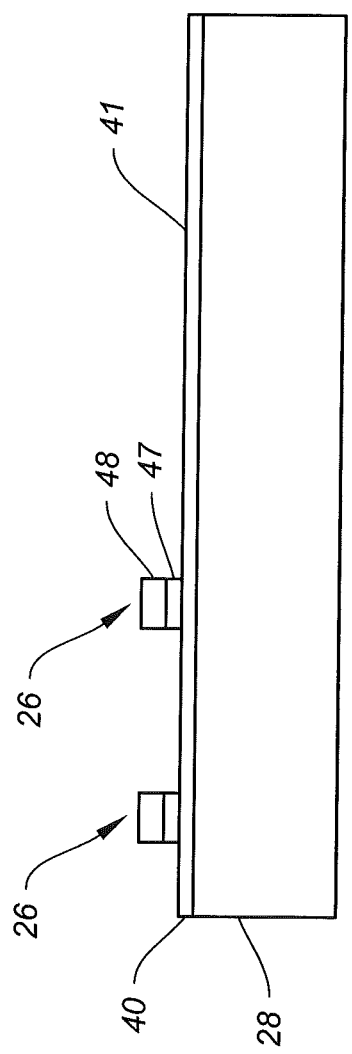
FIGS. 9A and 9B schematically show embodiments in which a thin lower layer of epoxy polymer is formed and then a thicker epoxy layer is formed over it.
Figure 9B:
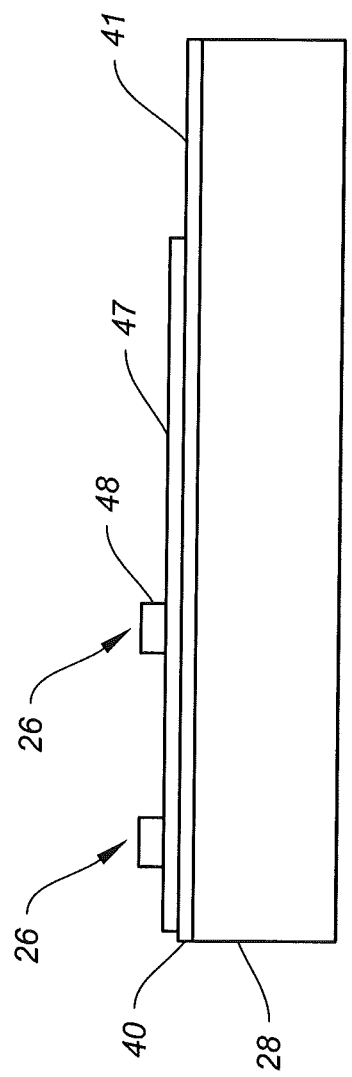

In some embodiments it has been found that if the thickness of epoxy polymer layer 44 is too great, additional stress can occur at the interface between epoxy layer 44 and the at least one inorganic layer 40 at surface 41, due, for example, to epoxy shrinkage during curing. As mentioned above, wall height can range from 0.5 micron to 20 microns in some embodiments. A thin epoxy layer, from around 0.5 micron to 5 microns, is typically found to be associated with an acceptable level of stress at the interface. If thicker epoxy layers are desired, it can be preferable to use a plurality of epoxy layers, as illustrated in FIGS. 9A and 9B. For example a thin first layer 47 of epoxy can be formed and patterned to form a portion of at least one wall 26 on the at least one inorganic layer 40 on substrate 28, where the alkoxysilane material containing a primary or secondary amine is applied to surface 41 before applying first epoxy layer 47. First epoxy layer 47 can be applied by spin coating a liquid resist such as TMMR (i.e. applying the resist and spinning the substrate 28), or by laminating a thin dry film of TMMF. After patterning the first epoxy layer 47, it is cured, typically at an appropriate elevated temperature. Then a second epoxy layer 48 is applied, patterned and cured to form a second portion of wall(s) 26 over the first portion to form a wall 26 having a height in the desired thickness range of 0.5 to 20 microns, without inducing an unacceptable amount of stress. Second epoxy layer 48 can also be applied by spin coating TMMR resist or by laminating TMMF dry film. In a particular embodiment, first epoxy layer 47 is applied by spin coating TMMR liquid resist, and second epoxy layer 48 is applied by laminating a TMMF dry film.

In FIG. 9A, the thin first epoxy layer 47 and the thicker second epoxy layer 48 have the same width, at least in this sectional view. For example, a cross-section across two heaters and two adjacent walls from FIG. 6 could have an appearance similar to FIG. 9A, since both the thin first layer 47 and the thicker second layer 48 are removed over the heaters. In FIG. 9B, the thin first layer 47 extends well beyond the patterned features of thicker second layer 48. Either or both of the configurations shown in FIGS. 9A and 9B can be used in various embodiments of microfluidic devices.

EXAMPLES

A variety of test samples were prepared and tested under different conditions to explore the effects of different adhesion promoters, different surface materials, different environmental stress conditions, and different epoxy layer configurations. Such tests can be used to determine satisfactory fabrication processes for microfluidic devices, such as liquid ejection printhead die or other types of devices, depending upon the surface material of the device underlying the epoxy layer, as well as the anticipated environment during storage or usage of the device.

Comparison of Adhesion Promoters after Soaking of Samples

TMMR epoxy layers were formed on a variety of inorganic materials and using a variety of different adhesion promoters. They were then soaked at 95 degrees C. in an aqueous ink for 2 weeks. Adhesion was tested and rated as none (i.e. the epoxy layer was completely removed), poor, fair, very good or excellent. Soaking at 95 degrees C. is a very stressful environment used in this accelerated test. Even samples that are rated as very good can have excellent adhesion after prolonged exposure to aqueous inks at a lower temperature.

As a control, TMMR samples were prepared on silicon nitride, silicon oxide, and tantalum surfaces without applying any adhesion promoter on the surface before applying the TMMR. After soaking, adhesion on all of these samples was rated as none.

For similar samples prepared using VM-652 adhesion promoter on the surface before applying the TMMR, after soaking the samples the adhesion on silicon nitride was fair, but adhesion was very good on both silicon oxide and on tantalum.

For similar samples prepared using an adhesion promoter on the surface including n-[3-(trimethoxysily)propyl]-ethylenediamine, which is also an alkoxysilane material containing a primary or secondary amine, after soaking the samples the adhesion was very good on silicon nitride, on silicon oxide and on tantalum.

For similar samples prepared using an adhesion promoter on the surface including a mixture of 3-aminopryopl trimethoxysilane and 1,2-bis(trimethoxysily) ethane, which are also alkoxysilane materials containing a primary or secondary amine, after soaking the samples the adhesion was excellent on silicon nitride and on silicon oxide, and very good on tantalum.

By comparison and contrast, for similar samples prepared using an adhesion promoter on the surface including (3-glycidoxypropyl)-trimethoxysilane (epoxy propyl trimethoxysilane), which is an adhesion promoter containing an epoxide but not containing a primary or secondary amine, after soaking the samples the adhesion was rated as fair on silicon nitride, but none for both silicon oxide and tantalum.

Comparison of Baking Cycles for VM-652 after Soaking of Samples

Having identified VM-652 as one example of an adhesion promoter including an alkoxysilane material containing a primary or secondary amine that provides excellent adhesion for a patterned SU-8 epoxy layer that can withstand aggressive soak testing, further tests were performed to explore the effect of time and temperature on the baking of the sample after the adhesion promoter is applied, but before the epoxy material is applied. Adhesion was tested with no exposure to liquid (also called dry adhesion), as well as after soaking in various aqueous inks at 95 degrees C. for 1 week, or in water at 95 degrees C. for 1 week, or in NMP (n-methylpyrrolidone) at 95 degrees C. for 3 days. NMP is an aggressive chemical solvent. Testing with a range of soak fluids can distinguish different adhesion under a range of environments. Acceptable baking cycles for a particular microfluidic device can depend upon what environment that device will be exposed to.

As mentioned above, in a December 2003 publication by HD Micro Systems on their VM-652 adhesion promoter (intended for improving adhesion of polyimide) says, "Although good adhesion is obtained by air-drying some products show increased adhesion with baking at 110-130 degrees C." For the control test samples using VM-652 for an adhesion promoter for TMMR SU-8 epoxy layers, it was found that heating the samples to 120 degrees C. after applying the VM-652 but before applying the TMMR epoxy, dry adhesion was very good. However, adhesion was rated as none for the samples that were soak tested in hot aqueous inks, poor for samples soak tested in hot water, and fair for samples soak tested in NMP.

For samples that were baked at 150 degrees C. (i.e. outside the manufacturer's recommended range) for ten minutes after applying the VM-652 but before applying the TMMR, dry adhesion was excellent. In addition, adhesion was very good for the samples that were soak tested in hot aqueous inks and for samples soak tested in hot water. However, adhesion was poor for samples soak tested in NMP.

For samples that were baked at 200 degrees C. (i.e. even further outside the manufacturer's recommended range) for 30 seconds after applying the VM-652 but before applying the TMMR, dry adhesion was very good. In addition, adhesion was very good for the samples that were soak tested in hot aqueous inks, for samples soak tested in hot water, and for samples soak tested in NMP.

For samples that were baked at 200 degrees C. for 1 minute after applying the VM-652 but before applying the TMMR, dry adhesion was excellent. In addition, adhesion was very good to excellent for the samples that were soak tested in hot aqueous inks, very good for samples soak tested in hot water, and very good for samples soak tested in NMP.

Comparison of Thick Epoxy Layer with Thin Epoxy Plus Thick Epoxy Layer

Samples were prepared with patterned layers of TMMR SU-8 epoxy, soaked in water or aqueous inks, and then examined under a microscope. For samples prepared without an adhesion promoter including an alkoxysilane containing a primary or secondary amine, such as VM-652, optical fringes could be seen in the SU-8 epoxy near regions where the epoxy had been patterned away to expose the underlying surface. This indicates that the soaking fluid had penetrated at the interface between the substrate surface and the SU-8 epoxy.

Similar samples were also prepared using VM-652 using either a thin layer of TMMR SU-8 epoxy, or a thick layer of TMMR SU-8 epoxy, or a thin layer that was cured followed by applying and curing a thick layer of TMMR SU-8 epoxy. It was found that for a thin layer alone or for a thin layer plus a thick layer of TMMR SU-8, if the sample was baked at 200 degrees C. for several minutes after application of VM-652 and before application of TMMR, no sign of penetration by the soaking fluid could be seen. However, for samples having a thick TMMR layer with no underlying thin layer, even samples baked for 3 minutes at 200 degrees C. showed signs of penetration by the soaking fluid.

The invention has been described in detail with particular reference to certain preferred embodiments thereof, but it will be understood that variations and modifications can be effected within the spirit and scope of the invention

PARTS LIST

- 10 Inkjet printing system
- 12 Image data source
- 14 Controller
- 16 Electrical pulse source
- 18 Liquid ejection printhead die
- 20 Liquid ejector
- 22 Ink drop
- 24 Recording medium
- 26 Wall
- 28 Substrate
- 30 Chamber
- 31 Nozzle plate
- 32 Nozzle
- 34 Resistive heater
- 36 Feed hole
- 36a & b Feed hole
- 37 Blind feed holes
- 40 Inorganic layer(s)
- 41 Surface (of inorganic layer(s))
- 42 Feed openings
- 43 Backside (of substrate)
- 44 Polymer layer
- 46 Outer passivation layer
- 47 First epoxy layer
- 48 Second epoxy layer
- 200 Carriage
- 250 Printhead chassis
- 251 Printhead die 253 Nozzle array
254 Nozzle array direction
256 Encapsulant
257 Flex circuit
258 Connector board
262 Multi-chamber ink supply
264 Single-chamber ink supply
300 Printer chassis
302 Paper load entry direction
303 Print region
305 Carriage scan direction
306 Right side of printer chassis
307 Left side of printer chassis
308 Front of printer chassis
380 Carriage motor
382 Carriage guide rail
383 Encoder fence
384 Belt

The invention claimed is:

1. A method for making a microfluidic device, the method comprising:
providing at least one inorganic layer on a substrate;
applying an alkoxysilane material containing a primary or secondary amine on the at least one inorganic layer;
baking the applied alkoxysilane material at a temperature greater than 130 degrees C.;
applying an epoxy material to form an epoxy layer, wherein the applied alkoxysilane material is disposed at an interface between the epoxy layer and the at least one inorganic layer; and
patterning the epoxy layer to provide a wall for defining a location for a fluid in the microfluidic device.

2. The method according to claim 1, wherein baking the applied alkoxysilane material further comprises placing the substrate on a hot plate at a temperature of at least 150 degrees C.

3. The method according to claim 2 further comprising placing the substrate on the hot plate for at least one minute.

4. The method according to claim 2 further comprising placing the substrate on the hot plate for at least ten minutes.

5. The method according to claim 1, wherein baking the applied alkoxysilane material further comprises placing the substrate on a hot plate at a temperature of approximately 200 degrees C.

6. The method according to claim 5 further comprising placing the substrate on the hot plate for at least 20 seconds.

7. The method according to claim 5 further comprising placing the substrate on the hot plate for at least 2 minutes.

8. The method according to claim 1, wherein the applied alkoxysilane material comprises aminopropyl trimethoxysilane, bis[3-(trimethoxysily)-propyl]amine, n-[3-(trimethoxysily)propyl]-ethylenediamine, or a-amino propyltriethoxysilane.

9. The method according to claim 1, wherein applying the alkoxysilane material comprises:
flooding a surface of the substrate including the at least one inorganic layer with the alkoxysilane material; and
spinning the substrate.

10. The method according to claim 1, wherein applying the epoxy material comprises applying a photoimageable epoxy material.

11. The method according to claim 10, wherein patterning the epoxy layer comprises exposing the photoimageable epoxy layer through a mask.

12. The method according to claim 1, wherein the epoxy material comprises SU-8.

13. The method according to claim 1, wherein the epoxy material comprises an alkoxysilane material containing an epoxide.

14. The method according to claim 1, wherein forming the epoxy layer comprises spinning the substrate.

15. The method according to claim 1, wherein applying the epoxy material comprises laminating an epoxy film.

16. The method according to claim 1, wherein the epoxy layer includes a thickness between 0.5 micron and 5 microns.

17. The method according to claim 1, the epoxy layer being a first epoxy layer, further comprising:
curing the patterned first epoxy layer; and
applying a second epoxy layer over the cured first epoxy layer;
patterning the second epoxy layer;
and curing the second epoxy layer.

18. The method according to claim 17, wherein the first epoxy layer includes a thickness between 0.5 micron and 5 microns.

19. The method according to claim 17, wherein forming the first epoxy layer comprises spinning the substrate, and wherein applying the second epoxy layer comprises laminating an epoxy film.

20. The method according to claim 1, wherein the at least one inorganic layer comprises a metal.

21. The method according to claim 1, wherein the at least one inorganic layer comprises silicon.

22. The method according to claim 1, wherein the at least one inorganic layer comprises an oxide.

23. The method according to claim 1, wherein the at least one inorganic layer comprises a nitride.

24. The method according to claim 1 further comprising oxygen plasma treatment of the at least one inorganic layer before applying the alkoxysilane material.

* * * * *